United States Patent
Zimmerman et al.

(10) Patent No.: US 9,786,559 B2
(45) Date of Patent: Oct. 10, 2017

(54) PROCESS AND MATERIAL FOR PREVENTING DELETERIOUS EXPANSION OF HIGH ASPECT RATIO COPPER FILLED THROUGH SILICON VIAS (TSVS)

(71) Applicant: INTEL CORPORATION, Santa Clara, CA (US)

(72) Inventors: Paul A. Zimmerman, Phoenix, AZ (US); Scott B. Clendenning, Portland, OR (US); Patricio E. Romero, Portland, OR (US); Paul B. Fischer, Portland, OR (US); Robert Edgeworth, Phoenix, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/044,976

(22) Filed: Feb. 16, 2016

(65) Prior Publication Data

US 2016/0163596 A1 Jun. 9, 2016

Related U.S. Application Data

(62) Division of application No. 13/997,577, filed as application No. PCT/US2012/031486 on Mar. 30, 2013, now abandoned.

(51) Int. Cl.
*H01L 21/44* (2006.01)
*H01L 21/768* (2006.01)
(Continued)

(52) U.S. Cl.
CPC .... *H01L 21/76898* (2013.01); *H01L 21/0228* (2013.01); *H01L 21/02181* (2013.01);
(Continued)

(58) Field of Classification Search
CPC ......... H01L 21/76898; H01L 21/02181; H01L 21/02189; H01L 21/02194;
(Continued)

(56) References Cited

U.S. PATENT DOCUMENTS

| 4,876,120 A | 10/1989 | Belke et al. |
| 4,885,329 A | 12/1989 | Tominaga et al. |

(Continued)

FOREIGN PATENT DOCUMENTS

WO     2013147856 A1     10/2013

OTHER PUBLICATIONS

International Search Report and Written Opinion received for PCT Patent Application No. PCT/US2012/031486, mailed on Nov. 29, 2012. 9 pages.
(Continued)

*Primary Examiner* — Phat X Cao
*Assistant Examiner* — Mohammad M Hoque
(74) *Attorney, Agent, or Firm* — Finch & Maloney PLLC (57) ABSTRACT

Techniques are disclosed for forming through-silicon vias (TSVs) implementing a negative thermal expansion (NTE) material such as zirconium tungstate ($ZrW_2O_8$) or hafnium tungstate ($HfW_2O_8$). In some cases, the NTE material is disposed between the substrate and conductive core material of the TSV and serves to offset, at least in part, the coefficient of thermal expansion (CTE) mismatch there between, thus reducing heat-induced stresses and/or protrusion (pumping) of the conductive core material. The NTE material also may protect against leakage, voltage breakdown, and/or diffusion of the conductive core material. Furthermore, the NTE material may reduce radial stresses in high-aspect-ratio TSVs. In some cases, techniques disclosed herein may improve TSV reliability, enhance three-dimensional integration, and/or enhance performance in three-dimensional inte-
(Continued)

grated circuits and/or other three-dimensional packages. Other embodiments which can employ techniques described herein will be apparent in light of this disclosure.

12 Claims, 6 Drawing Sheets (51) Int. Cl.
　　　H01L 23/64　　　(2006.01)
　　　H01L 23/48　　　(2006.01)
　　　H01L 25/065　　(2006.01)
　　　H01L 21/02　　　(2006.01)
　　　H01L 23/60　　　(2006.01)
(52) U.S. Cl.
　　　CPC .. *H01L 21/02189* (2013.01); *H01L 21/02194* (2013.01); *H01L 21/02205* (2013.01); *H01L 21/76831* (2013.01); *H01L 21/76837* (2013.01); *H01L 21/76841* (2013.01); *H01L 21/76871* (2013.01); *H01L 21/76879* (2013.01); *H01L 23/481* (2013.01); *H01L 23/642* (2013.01); *H01L 25/0657* (2013.01); *H01L 23/60* (2013.01); *H01L 2224/16146* (2013.01); *H01L 2225/06513* (2013.01); *H01L 2225/06544* (2013.01)
(58) Field of Classification Search
　　　CPC ......... H01L 21/02205; H01L 21/76831; H01L 21/76871; H01L 21/0228; H01L 21/76879; H01L 23/481; H01L 25/0657; H01L 23/642; H01L 21/76841; H01L 21/76837; H01L 2225/00
　　　USPC ........................................................ 438/667
　　　See application file for complete search history.

(56) References Cited

U.S. PATENT DOCUMENTS

| | | | |
|---|---|---|---|
| 5,426,714 A | 6/1995 | Gadkaree et al. | |
| 6,200,893 B1* | 3/2001 | Sneh | C23C 16/44 117/92 |
| 6,365,269 B1 | 4/2002 | Atzesdorfer et al. | |
| 2001/0041039 A1* | 11/2001 | Hattori | G02B 6/105 385/129 |
| 2003/0091285 A1 | 5/2003 | Tsai et al. | |
| 2003/0187117 A1 | 10/2003 | Starkovich | |
| 2003/0218271 A1* | 11/2003 | Morito | C04B 35/495 264/235 |
| 2004/0075944 A1* | 4/2004 | Macken | G11B 5/10 360/123.28 |
| 2004/0160751 A1 | 8/2004 | Inagaki et al. | |
| 2005/0110168 A1* | 5/2005 | Chuang | H01L 23/06 257/788 |
| 2005/0157478 A1 | 7/2005 | Inagaki et al. | |
| 2006/0012967 A1 | 1/2006 | Asai et al. | |
| 2006/0204776 A1* | 9/2006 | Chen | B81B 3/0072 428/616 |
| 2006/0211809 A1 | 9/2006 | Kodemura et al. | |
| 2006/0237850 A1 | 10/2006 | Yuan et al. | |
| 2006/0290002 A1* | 12/2006 | Arana | H01L 21/76898 257/774 |
| 2007/0001266 A1 | 1/2007 | Arana et al. | |
| 2007/0045623 A1* | 3/2007 | Jin | H01L 21/823807 257/43 |
| 2007/0123410 A1 | 5/2007 | Morena et al. | |
| 2007/0246819 A1* | 10/2007 | Hembree | G01R 1/06716 257/698 |
| 2008/0009211 A1 | 1/2008 | Himes et al. | |
| 2008/0193791 A1* | 8/2008 | Ahn | C23C 8/02 428/640 |
| 2008/0242787 A1 | 10/2008 | Kim et al. | |
| 2008/0265423 A1* | 10/2008 | Ruben | A61B 5/0215 257/761 |
| 2009/0032962 A1 | 2/2009 | Hougham et al. | |
| 2009/0110909 A1 | 4/2009 | Innocenzo et al. | |
| 2009/0231782 A1 | 9/2009 | Fujita et al. | |
| 2010/0065314 A1 | 3/2010 | Lin et al. | |
| 2011/0095435 A1 | 4/2011 | Volant et al. | |
| 2011/0221044 A1 | 9/2011 | Danek et al. | |
| 2011/0284386 A1* | 11/2011 | Willey | C25D 3/38 205/96 |
| 2012/0026074 A1 | 2/2012 | Lee et al. | |
| 2012/0040196 A1 | 2/2012 | Kubota et al. | |
| 2013/0187287 A1 | 7/2013 | Park et al. | |
| 2013/0223922 A1 | 8/2013 | Koval et al. | |
| 2013/0320538 A1 | 12/2013 | Jindal et al. | |
| 2014/0038406 A1 | 2/2014 | Hembree et al. | |
| 2014/0117559 A1 | 5/2014 | Zimmerman et al. | |
| 2016/0163596 A1* | 6/2016 | Zimmerman | H01L 23/481 438/667 |

OTHER PUBLICATIONS

Takenaka, Koshi, "Negative thermal expansion materials: technological key for control of thermal expansion," IOP Publishing, Science and Technology of Advanced Materials, 13 (2012) 11 pages.
Ramm, et al., "Through Silicon Via Technology-Processes and Reliability for Wafer-Level 3D System Integration," Electronic Components and Technology Conference, 2008. pp. 841-846.
Lu, et al., "Stress Analyses and Mechanical Reliability of 3D Interconnects with Through Silicon Vias," Microelectronics Research Center, Department of Aerospace Engineering and Engineering Mechanics, University of Texas at Austin, Jun. 15, 2009. 24 pages.
Song, et al., "High aspect ratio copper through-silicon-vias for 3D integration," Microelectronic Engineering, vol. 85 (2008). pp. 1952-1956.
"Zirconium Tungstate," http://en.wikipedia.org/wiki/Zirconium_tungstate, Retrieved from the Internet Mar. 9, 2012. 4 pages.
International Preliminary Report on Patentability received for PCT Patent Application No. PCT/US2012/031486, mailed on Oct. 9, 2014. 6 pages.

* cited by examiner

PROCESS AND MATERIAL FOR PREVENTING DELETERIOUS EXPANSION OF HIGH ASPECT RATIO COPPER FILLED THROUGH SILICON VIAS (TSVS)

CROSS-REFERENCE TO RELATED APPLICATIONS

This patent application is a Divisional of U.S. patent application Ser. No. 13/997,577, filed on Jun. 24, 2013, and titled "Process and Material for Preventing Deleterious Expansion of High Aspect Ratio Copper Filled Through Silicon Vias (TSVs)," which is a national stage entry under 35 U.S.C. §371 of PCT International Patent Application No. PCT/US2012/031486, filed on Mar. 30, 2012, and titled "Process and Material for Preventing Deleterious Expansion of High Aspect Ratio Copper Filled Through Silicon Vias (TSVs)," each of which is herein incorporated by reference in its entirety.

BACKGROUND

Integrated circuit (IC) design involves a number of non-trivial challenges, and ICs implementing through-silicon vias have faced particular complications, such as those with respect to minimizing packaging stress while optimizing device parameters and circuit performance. Continued process scaling will tend to exacerbate such problems.

DETAILED DESCRIPTION

Techniques are disclosed for forming through-silicon vias (TSVs) implementing a negative thermal expansion (NTE) material such as zirconium tungstate ($ZrW_2O_8$) or hafnium tungstate ($HfW_2O_8$). In some cases, the NTE material is disposed between the substrate and conductive core material of the TSV and serves to offset, at least in part, the coefficient of thermal expansion (CTE) mismatch there between, thus reducing heat-induced stresses and/or protrusion (pumping) of the conductive core material. The NTE material also may protect against leakage, voltage breakdown, and/or diffusion of the conductive core material. Furthermore, the NTE material may reduce radial stresses in high-aspect-ratio TSVs. In some cases, techniques disclosed herein may improve TSV reliability, enhance three-dimensional integration, and/or enhance performance in three-dimensional integrated circuits and/or other three-dimensional packages. Other embodiments which can employ techniques described herein will be apparent in light of this disclosure.

General Overview

As process scaling of IC devices progresses, maintaining device performance using traditional process techniques is becoming increasingly economically prohibitive. Also, conventional resistive-capacitive (RC) scaling techniques using ultra-low-K materials will yield minimal or no additional gains due to the limitations inherent to such techniques, as will be appreciated. Thus, there is need for an alternative approach for improving performance, for example, in integrated circuits (ICs) and interconnects.

A through-silicon via (TSV) is a vertical, electrical connection that passes completely through a silicon substrate (e.g., silicon wafer/die). TSVs may be used, for example, to interconnect multiple active circuit layers (e.g., stacked chips) in a single chip, thereby forming a three-dimensional IC or other three-dimensional package.

Figures 1A, 1B:
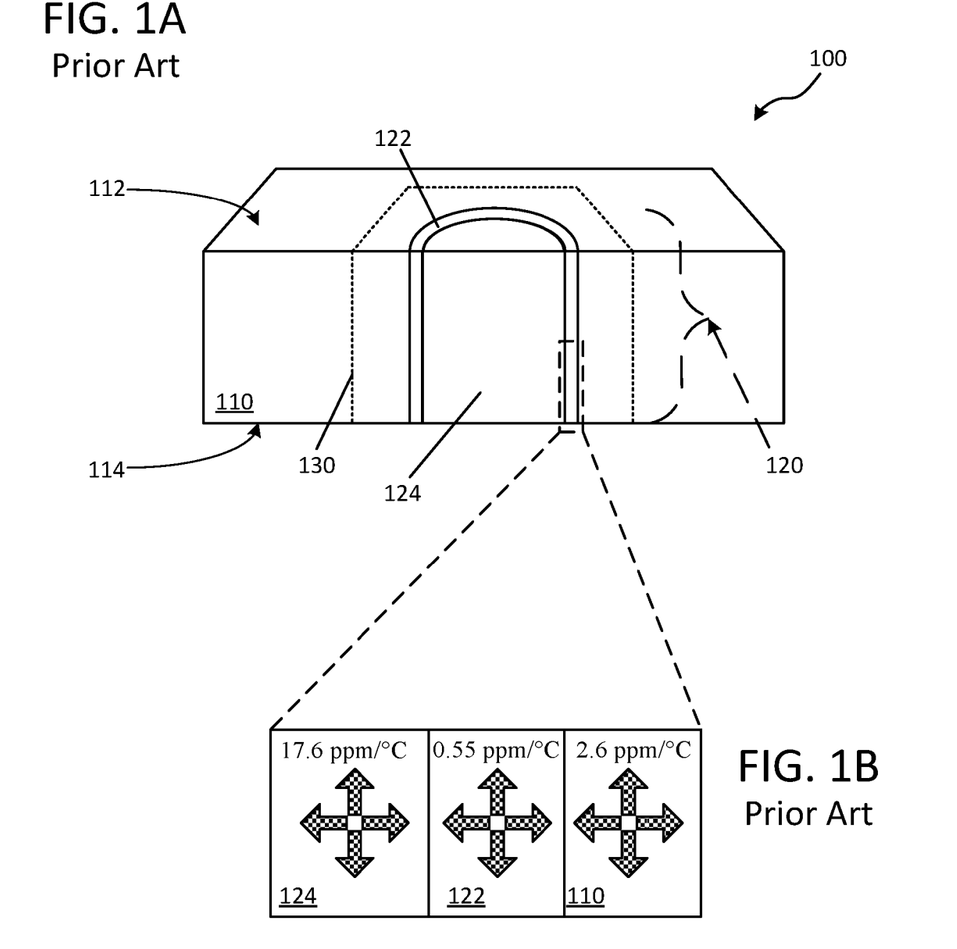
FIG. 1A illustrates a cross-section view of a planar integrated circuit implementing an example through-silicon via (TSV).
FIG. 1B illustrates a partial view of a TSV, the view corresponding to the portion of FIG. 1A enclosed by the dashed box therein.

FIG. 1A illustrates a cross-section view of a planar integrated circuit 100 implementing an example TSV 120. TSV 120 is formed in a silicon (Si) substrate 110 (e.g., Si wafer/die) by first etching substrate 110 to define a through-hole passing from a first surface 112 of the substrate 110 to the opposing surface 114 thereof. Then, a layer of dielectric material 122, such as silicon dioxide ($SiO_2$), is formed/deposited along the interior surface of the through-hole in the substrate 110. Finally, an electrically conductive material 124, such as copper (Cu), tungsten (W), or aluminum (Al) is deposited in the remainder of the through-hole to provide an electrical connection between surfaces 112 and 114 of substrate 110.

As previously noted, there are a number of non-trivial issues associated with TSV design. One such non-trivial issue pertains to the coefficient of thermal expansion (CTE) mismatch between the materials that can be employed in a TSV 120, summarized below in Table 1. As can be seen, each of the materials used in the example TSV 120 has a positive-value CTE, indicating that the material expands upon heating.

TABLE 1

| Material: | CTE at ~20° C.: |
| --- | --- |
| Copper (Cu) | 17.6 ppm/° C. |
| Aluminum (Al) | 23.6 ppm/° C. |
| Tungsten (W) | 4.5 ppm/° C. |
| Silicon (Si) | 2.6 ppm/° C. |
| Silicon dioxide (SiO$_2$) | 0.55 ppm/° C. |

FIG. 1B illustrates a partial view of TSV 120, the view corresponding to the portion of FIG. 1A enclosed by the dashed box as shown. In light of the data of Table 1, each of Si substrate 110, SiO$_2$ layer 122, and Cu core 124 will expand upon experiencing an increase in temperature, as generally represented by the directional arrows depicted in FIG. 1B. However, as is evident from Table 1, copper core 124 has a significantly higher CTE compared to both Si substrate 110 and SiO$_2$ layer 122. Correspondingly, upon heating, Cu core 124 expands to a substantially greater degree than the surrounding SiO$_2$ layer 122 and Si substrate 110, thus imposing substantial mechanical stress on those surrounding portions.

These heat-induced stresses often produce reliability problems such as, but not limited to: (1) substrate cracking; (2) interface delamination; and (3) transistor performance degradation. Local thermal expansion mismatching between copper and the silicon/dielectric can result in deformation of copper-filled TSVs 120, thus presenting serious reliability concerns which detract from the appeal of using such TSVs 120 in three-dimensional integrated structures (e.g., three-dimensional ICs or other 3-D packages), for example.

Heat-induced stresses resulting from the CTE mismatch can occur during thermal processing as well as during normal operation conditions. For instance, during thermal processing, the copper is annealed post-deposition (e.g., after it has been deposited within the through-hole in the substrate) to optimize its resistance. The annealing can be done at a high temperature to achieve the lowest possible copper resistivity; this is especially true as line width decreases. Testing reveals that the annealing process produces substantial heat-induced stress in the copper, dielectric, and substrate materials. Also, the high-temperature annealing process may result in protrusion (pumping) of the copper through the TSV 120 and introduction of micro-voids in the copper core 124 after the annealing, regardless of the purity of the components used, for example, in the electrochemical bath used when electroplating to fill the TSV 120 with copper 124. Furthermore, during temperature cycling and/or performance testing, a copper-filled TSV may be subjected to high temperature operation, which may produce heat-induced stresses.

Figure 2A:
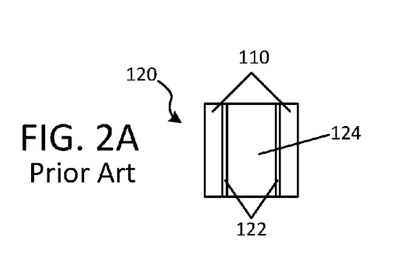
FIG. 2A illustrates a cross-section view of a series of TSVs of varying aspect ratio.
Figure 2B:
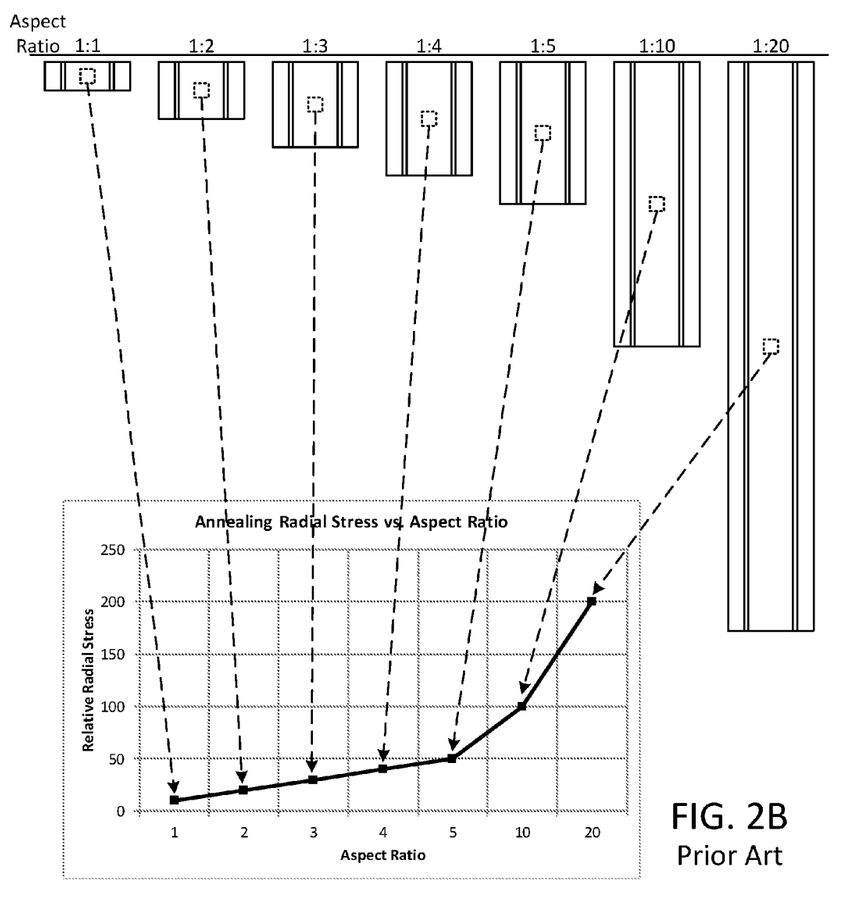
FIG. 2B illustrates a graph representing relative radial stress as a function of aspect ratio.

Another non-trivial issue pertains to the discovery that, as the aspect ratio of a TSV increases (e.g., such as by increasing the length/depth of the through-hole), the effects of the aforementioned heat-induced stresses are exacerbated. FIG. 2A illustrates a cross-section view of a series of TSVs 120 of varying aspect ratio, while FIG. 2B illustrates a graph representing relative radial stress as a function of aspect ratio. FIG. 2B demonstrates that as the aspect ratio of a copper-filled TSV 120 increases, so too does the relative radial stress observed in the central regions approximated/enclosed by the dashed boxes in FIG. 2A. In part, this is because increasing the aspect ratio of a copper-filled TSV 120 does not alter the micro-grain structure of the Cu core 124 deposited therein, which translates to high stress being localized in the center of the TSV 120, as forces are not transferred vertically (along the length/depth of the TSV 120) due to the random grain orientation. As aspect ratio and scaling density of TSVs increases, protrusion effects and stresses on bonded chips, for example, may increase.

Returning to FIGS. 1A and 1B, yet another non-trivial issue pertains to the large keep-out-zones (KOZs) 130 which can be designated around TSVs 120 to denote the region where device performance will be degraded if additional components are included therein (e.g., KOZ 130 may be designated to correspond with thermal management and/or mounting constraints). The large KOZs 130 impose substantial design restrictions on TSVs 120, thus limiting the ease and desirability of implementation of TSVs 120 in products/technologies, such as those involving 3-D interconnects. Conventional techniques cannot mitigate/eliminate the stress build-up and large KOZs 130 associated with conventional TSVs.

Thus, and in accordance with an embodiment of the present invention, techniques are disclosed for implementing through-silicon vias (TSVs) utilizing a material that undergoes negative thermal expansion (NTE). In some cases, the NTE material is disposed between the electrically conductive core (e.g., a high-CTE material such as copper, or other suitably conductive material such as tungsten or aluminum) of the TSV and the surrounding substrate. Because the NTE material has a negative coefficient of thermal expansion (NCTE), the NTE material contracts rather than expands upon heating, such as may occur during thermal processing (e.g., annealing) and/or temperature cycling (e.g., operation at normal/high temperatures) of the TSV, thereby eliminating or otherwise reducing the stress build-up. It should be noted that although a focus on through-silicon vias is provided, numerous other via or through-hole structures can be implemented and benefit from techniques provided herein as will be appreciated in light of this disclosure, and the claimed invention is not intended to be limited to vias in silicon. Factors such as material and process compatibilities can be considered in selecting appropriate NTE materials for a given through-hole or via material scheme.

In some embodiments, inclusion of an NTE material may eliminate or otherwise reduce/mitigate heat-induced stress normally resulting from CTE-mismatching between the constituent materials of a TSV. As will be appreciated in light of this disclosure, the copper core of a copper-filled TSV, for example, expands when it is heated during thermal processing (e.g., post-deposition annealing) and/or temperature cycling (e.g., high temperature operating conditions). Conversely, the NTE material contracts upon heating. Thus, and in accordance with an embodiment, an NTE material may be used to offset, at least in part, the otherwise deleterious expansion of the copper core of a copper-filled TSV. Consequently, the amount of heat-induced stress to which the surrounding substrate is subjected is lessened, thereby improving the reliability of the copper-filled TSV (e.g., more reliable joints and/or bonding layers) while allowing for optimized device performance (e.g., allowing for higher temperature annealing of the copper to achieve lower resistance).

In accordance with an embodiment, implementation of an NTE material in the design, for example, of a copper-filled TSV may reduce the degree of unwanted copper protrusion (pumping) that may occur with conventional TSV designs/methodologies.

In some embodiments, inclusion of an NTE material in the design of a copper-filled TSV, for example, may allow for increasing the aspect ratio thereof beyond the limited range capable with conventional TSV designs/methodologies. In part, this is because the NTE material may help to reduce radial stresses that otherwise preclude conventional techniques/methodologies from implementing high-aspect-ratio, copper-filled TSVs.

In accordance with an embodiment, inclusion of an NTE material in the design of a TSV may allow for decreases in the size (e.g., in one or more dimensions) of the minimal keep-out-zone (KOZ) surrounding the TSV. For instance, in some example embodiments, reductions in KOZ of up to about 80% as compared to conventional designs may be achieved by implementing an NTE material in the design of the TSV. This, in turn, may improve device scaling, increase cost-effectiveness, and/or minimize design/manufacturing restrictions.

In accordance with an embodiment, an NTE material having a sufficient density and/or other sufficient characteristics may be implemented in the design of a TSV to serve as a barrier layer (e.g., dielectric layer) that protects against, for example: (1) leakage; (2) voltage breakdown; and/or (3) diffusion of the electrically conductive core material. In some such cases, this may eliminate the need for conventional barrier layer processing steps.

In accordance with an embodiment, implementation of an NTE material in the design of a TSV may achieve a reduction in power consumption by the IC including such a TSV. For instance, TSVs implemented in accordance with some embodiments of the present invention may achieve power levels less than about 1 mW/Gbps, as compared to the 3-6 mW/Gbps for aggressive chip I/Os between sockets and boards.

As will be appreciated in light of this disclosure, some embodiments of the present invention may permit one or more of: (1) improvements over planar ICs; (2) improvements over conventional approaches to achieving three-dimensional ICs or other three-dimensional packages implementing TSVs, and/or (3) improvements in three-dimensional integration density.

Various observation techniques, such as Raman spectroscopy, may be used to detect stress reductions in the silicon substrate in which a TSV configured in accordance with an embodiment of the present invention is formed.

TSVs Implementing Negative Thermal Expansion (NTE) Material

Figure 3A:
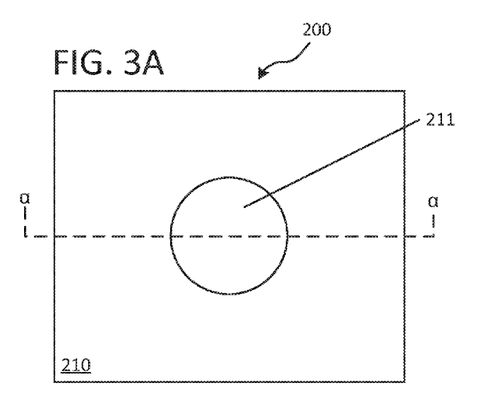
FIG. 3A illustrates a top-down view of an example integrated circuit (IC) after formation of a through-hole therein, in accordance with an embodiment of the present invention.
Figure 3B:
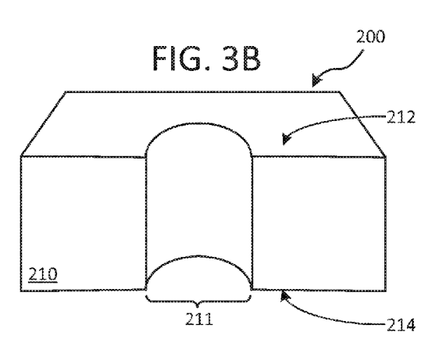
FIG. 3B illustrates a cross-section view of the example IC of FIG. 3A taken along dashed line α-α therein.

FIG. 3A illustrates a top-down view of an example integrated circuit (IC) 200 after formation of a through-hole 211 therein, in accordance with an embodiment of the present invention. FIG. 3B illustrates a cross-section view of the example IC 200 of FIG. 3A along dashed line α-α therein. In accordance with an embodiment of the present invention, substrate 210 may be, for example, a silicon (Si) semiconductor wafer/die or other substrate suitable for forming an IC 200. However, as previously noted, the claimed invention is not intended to be limited to vias/through-holes in silicon; thus, and in accordance with some other embodiments, substrate 210 may comprise, for example: a metal, germanium (Ge), III-V materials, oxide, nitride, and/or combinations thereof. Substrate 210 may be configured, for example, as a bulk substrate, a semiconductor-on-insulator (XOI, where X is a semiconductor material such as silicon, germanium, or germanium-enriched silicon), or a multi-layered structure, in some embodiments. The thickness of substrate 210 may be chosen, at least in part, based on the desired aspect ratio of a TSV to be formed therein; thus, and in accordance with an embodiment, substrate 210 may have a thickness, for example, in the range of about 10-100 μm or greater (e.g., less than or equal to about 60 μm). Substrate 210 may be configured to align with additional substrates, chips, layers, and/or dies to form, for example, three-dimensional ICs or other three-dimensional packages, in accordance with an embodiment. Other suitable materials, dimensions, and/or configurations for substrate 210 will depend on a given application and will be apparent in light of this disclosure.

As can be seen from FIG. 3A, a through-hole 211 may be etched into substrate 210, passing from a first surface 212 to a second, opposing surface 214 of substrate 210. In accordance with an embodiment, through-hole 211 may have any desired geometry including, but not limited to: cylindrical, cuboid, prismatic, polyhedral, and/or other geometry suitable for forming a TSV in substrate 210. In some cases, the shape of through-hole 211 may have a substantially uniform/homogeneous profile over its length from surface 212 to surface 214, while in other cases through-hole 211 may have a tapering or other non-uniform profile. In accordance with an embodiment, through-hole 211 may be formed/defined in substrate 210 as conventionally done, such as by deep reactive ion etching (DRIE) or other suitable etching process. The width (e.g., diameter, transverse distance, etc.) of through-hole 211 may be chosen, at least in part, based on the desired aspect ratio of the TSV to be formed; thus, and in accordance with an embodiment, through-hole 211 may have a width in the range of about 1-10 μm (e.g., about 3-5 μm or more). Likewise, the length (e.g., depth, vertical distance, etc.) of through-hole 211 may be chosen, at least in part, based on the desired aspect ratio of the TSV to be formed; thus, and in accordance with an embodiment, through-hole 211 may have a length in the range of about 1-200 μm (e.g., about 30-100 μm or more). Thus, as will be appreciated, by adjusting the various dimensions (e.g., width and/or length) of through-hole 211, varying aspect ratios may be achieved, such as, but not limited to: about 1:1, 1:2, 1:3, 1:4, 1:5, 1:10, 1:20, or greater. Other suitable configurations, dimensions, and/or methods for forming one or more through-holes 211 in substrate 210 will depend on a given application and will be apparent in light of this disclosure.

Also, note that some embodiments may implement, for example, a multilayer substrate, where the first surface 212 and/or second surface 214 may be internal layers and be in contact, for example, with other internal or external layers of substrate 210 (e.g., through-hole 211 may be formed in an interior portion of substrate 210). Further note that, in some embodiments, the first surface 212 and/or second surface 214 may be in contact, for example, with another one or more substrates and/or IC components (e.g., through-hole 211 may be formed in a substrate 210 that is in contact with another laterally/vertically adjacent substrate). These and other features/configurations are discussed in detail below with reference to FIGS. 6 and 7.

Figure 4A:
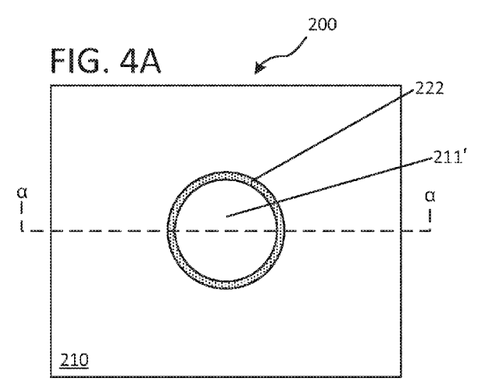
FIG. 4A illustrates a top-down view of an example IC after deposition of a negative thermal expansion (NTE) material, in accordance with an embodiment of the present invention.
Figure 4B:
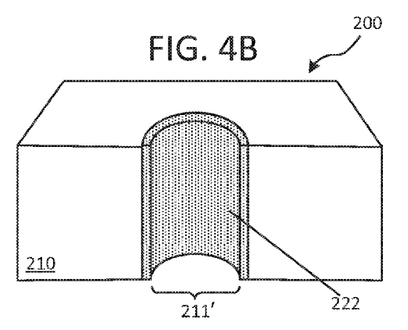
FIG. 4B illustrates a cross-section view of the example IC of FIG. 4A taken along dashed line α-α therein.

FIG. 4A illustrates a top-down view of an example IC 200 after deposition of an NTE material 222, in accordance with an embodiment of the present invention. FIG. 4B illustrates a cross-section view of the example IC 200 of FIG. 4A along dashed line α-α therein. As previously noted, materials which undergo negative thermal expansion (NTE) contract, rather than expand, upon heating over a given temperature range. Accordingly, such a material is said to have a negative coefficient of thermal expansion (NCTE). For a given NTE material, the contraction may be exhibited over a large or only a narrow temperature range, and in either case may be isotropic/anisotropic and/or constant/variable over such temperature range.

In accordance with an embodiment, numerous factors may be considered in determining the suitability of a given NTE material for implementation in the design of a TSV, such as, but not limited to: (1) compatibility with the process flow; (2) compatibility with one or more deposition techniques used in TSV fabrication (e.g., the NTE material is compatible with a given deposition process for achieving even, conformal coverage of the through-hole when deposited); (3) the ability to offset, at least in part, the expansion of the other TSV materials (e.g., the NTE material adequately contracts to accommodate, at least in part, the expansion of the conductive core material); and (4) the ability to allow deposition and adhesion of a suitable seed layer for enabling seamless deposition of the conductive core material (e.g., the NTE material does not inhibit formation of a suitable seed layer for electroplating the core material). This brief listing is not intended to limit the claimed invention, and other pertinent factors regarding the suitability of a given NTE material will depend on a given application and will be apparent in light of this disclosure.

Table 2 below lists two non-limiting examples of NTE materials suitable for use in TSVs, in accordance with an embodiment of the present invention, as well as their approximate NCTE value.

TABLE 2

| NTE Material: | NCTE at ~20° C.: |
|---|---|
| Zirconium tungstate ($ZrW_2O_8$) | ~−9.0 ppm/° C. |
| Hafnium tungstate ($HfW_2O_8$) | |

It should be noted, however, that the claimed invention is not intended to be limited to these two example NTE materials, and other suitable NTE materials will depend on a given application, temperature range, substrate material, and/or conductive core material, as will be apparent in light of this disclosure. For instance, other possible examples of suitable NTE materials include, but are not limited to: $Zr_2(MoO_4)_3$; $Zr_2(WO_4)_3$; $ZrV_2O_7$; $ZrMo_2O_8$; $HfMo_2O_8$; $Hf_2(MoO_4)_3$; and/or $Hf_2(WO_4)_3$.

As opposed to the positive-CTE materials discussed above with reference to Table 1, the example NTE materials listed with reference to Table 2 contract upon heating rather than expand, at least over a given temperature range (e.g., up to about 780° C.). For example, and in accordance with an embodiment, $ZrW_2O_8$ will shrink by about −9 ppm/° C. when implemented, for instance, over the temperature range observed in thermal processing and/or temperature cycling of a TSV.

As can be seen by comparing the data of Tables 1 and 2, and in accordance with an embodiment, the NCTE of $ZrW_2O_8$ (~−9 ppm/° C.), for example, compensates for about one-half of the CTE of Cu (17.6 ppm/° C.). Depending on a given application, this may provide sufficient offset/accommodation of the expansion of the copper core in a copper-filled TSV, and thus improve the reliability of that TSV. In any case, and in accordance with an embodiment, NTE materials such as $ZrW_2O_8$ and $HfW_2O_8$ provide better offset/accommodation of the expansion of high-CTE materials (e.g., copper) than the positive-CTE $SiO_2$ conventionally implemented as a dielectric layer 122 in TSVs 120, such as that discussed above with reference to FIGS. 1A and 1B.

In some embodiments, NTE material 222 may be implemented, for example, as a layer having a thickness in the range of about 10 nm-10 μm (e.g., about 100 nm-1 μm), while in other embodiments it may be implemented as a monolayer (e.g., having a thickness in the range of about 10-1,000 Å). The layer of NTE material 222, as deposited/ formed on the interior surface of through-hole 211 (and/or an optional intermediate capacitive/oxide layer, discussed in detail below), may be substantially homogeneous/uniform or otherwise varied depending on a given application, in accordance with an embodiment. In some cases, the profile (e.g., thickness and/or uniformity) of NTE material 222 may be chosen, at least in part, based on the geometry of through-hole 211, discussed above with reference to FIG. 3A. In some cases, benefits stemming from the characteristic contraction of a given NTE material 222 may be more readily realized and/or more pronounced (e.g., greater offset/accommodation of the expansion of a high-CTE conductive core material) with implementation of thicker layers of NTE material 222, in accordance with an embodiment. As will be appreciated, other suitable thicknesses/layering configurations will depend on a given application and will be apparent in light of this disclosure.

In accordance with an embodiment, NTE material 222 may be deposited using any suitable deposition process, including, but not limited to: atomic layer deposition (ALD); chemical vapor deposition (CVD); physical vapor deposition (PVD); spin coating deposition; reflow-based deposition; and/or custom/modified variations of such processes. Other suitable deposition techniques will depend on a given application and will be apparent in light of this disclosure.

In some instances, and in accordance with some embodiments, ALD of NTE material 222 can be used to provide a number of benefits. For example, ALD of NTE material 222 may allow for uniform, conformal coverage of the interior surface of through-hole 211 (e.g., ensure sufficient deposition for small diameter and/or high-aspect-ratio through-holes 211). As a further example, ALD may allow for in situ synthesis of the NTE material 222. For instance, ALD can be used to allow for in situ synthesis of zirconium tungstate ($ZrW_2O_8$) by individually depositing its constituent binary oxides: zirconium dioxide ($ZrO_2$) and tungsten trioxide ($WO_3$). More specifically, $ZrW_2O_8$ may be deposited/ formed on an interior surface of through-hole 211 (and/or an optional intermediate capacitive/oxide layer, discussed in detail below) by pulsing one and then the other of an appropriate Zr precursor (e.g., $Zr^{+4}$) and an appropriate W precursor (e.g., $W^{+6}$), with interwoven pulses of an oxidizing co-reactant such as, but not limited to, water ($H_2O$), hydrogen peroxide ($H_2O_2$), oxygen ($O_2$), oxygen plasma, and/or ozone ($O_3$) to form $ZrW_2O_8$. As will be appreciated, this ensures that the ALD process windows for $ZrO_2$ and $WO_3$ overlap (e.g., no intermediate heating process). By combining super-cycles of ALD $ZrO_2$ and ALD $WO_3$, for example, in a 1:2 stoichiometric ratio, $ZrW_2O_8$ may be deposited/formed. In some cases, a suitable W(VI) organometallic precursor (e.g., having suitable volatility and/or thermal stability) may be implemented in the ALD process, in accordance with an embodiment.

More specifically, and in accordance with one specific example embodiment, a $ZrW_2O_8$ film may be conformally deposited (e.g., uniform, controlled thickness, etc.) in a high-aspect-ratio TSV using ALD. The ALD $ZrW_2O_8$ may be deposited by interweaving cycles of an ALD $ZrO_2$ process and an ALD $WO_3$ process in an appropriate ratio. For example, the ALD $ZrO_2$ process may consist of alternating exposure of the substrate 210 (having a through-hole 211 therein) to saturating doses of $ZrCl_4$ or a tetrakis(amido) zirconium(IV) precursor and water, for instance, while the ALD $WO_3$ process may consist of alternating exposure of the substrate 210 (with through-hole 211) to saturating doses of bis(tert-butylimino)bis(dimethylamino)tungsten(VI), water, and ozone. Such a process can be carried out, for example, from 300-350° C. with the ratio of ALD $ZrO_2$ and ALD $WO_3$ cycles tuned to achieve a 1:2 stoichiometric ratio of Zr:W in the resultant metal oxide (e.g., zirconium tungstate, $ZrW_2O_8$) film. In accordance with another specific example embodiment, similar ALD processing also could be envisaged with other Zr(IV) and W(VI) precursors and oxidizing co-reactants, such as, but not limited to, $O_2$, $O_2$ plasma, $H_2O_2$, $H_2O_2$, and $O_3$, as will be appreciated in light of this disclosure.

Following deposition of the $ZrW_2O_8$ film by ALD, the metals may not be fully oxidized and/or the desired crystallographic phase of $ZrW_2O_8$ may not be present; thus, and in accordance with a specific example embodiment, a post-deposition annealing in an oxygen-rich environment, for instance, may be carried out to achieve the desired oxidation state of Zr (e.g., $Zr^{+4}$) and W (e.g., $W^{+6}$). For example, and in accordance with an embodiment, a substrate 210 having a layer of NTE material 222 (e.g., $ZrW_2O_8$) deposited as previously described may be placed in a vacuum oven or other suitable chamber which may serve as a suitable heat source and maintain pressurization, which is subsequently pumped down to a reduced pressure (e.g., less than or equal to about 100 mbar) and then filled with pure oxygen. A slight overpressure of oxygen in the oven/chamber may be sustained to maintain a reducing environment during the thermal cycle. The oven/chamber temperature may be ramped to a temperature in the range of about 300-450° C. (e.g., less than or equal to about 384° C.) over a period of time (e.g., less than or equal to about 3 hours) and then held at the chosen temperature for a period of time (e.g., less than or equal to about 1 hour). The oven/chamber then may be cooled to a lower temperature (e.g., less than or equal to about 140° C.) and vented, at which point the substrate 210 with attendant NTE layer 222 of $ZrW_2O_8$ may be removed from the oven/chamber.

As will be appreciated in light of this disclosure, such techniques are not limited to formation/deposition only of $ZrW_2O_8$ as NTE layer 222. For example, and in accordance with another specific example embodiment, an appropriate hafnium precursor such as $HfCl_4$ or a tetrakis(amido)hafnium(IV) compound may be substituted for the aforementioned zirconium precursors, to form an NTE layer 222 of $HfW_2O_8$. Other suitable techniques for forming $ZrW_2O_8$, $HfW_2O_8$, and/or other suitable NTE materials in a through-hole 211 of a substrate 210 by ALD and/or other suitable methods will depend on a given application, temperature range, substrate material, and/or conductive core material, as will be apparent in light of this disclosure.

Returning to FIG. 4B, as can be seen, after a layer of NTE material 222 has been deposited/formed on the interior surface of through-hole 211, a portion 211' (of through-hole 211) remains unfilled.

Figure 5A:
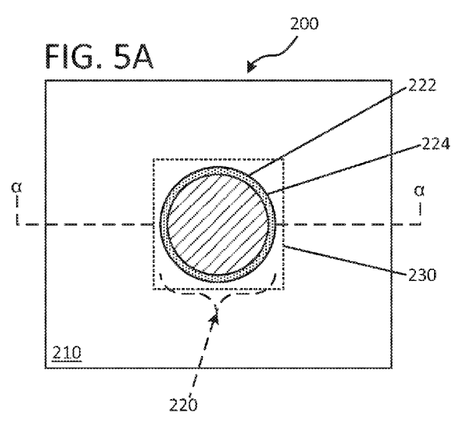
FIG. 5A illustrates a top-down view of an example IC after deposition of an electrically conductive material, in accordance with an embodiment of the present invention.
Figure 5B:
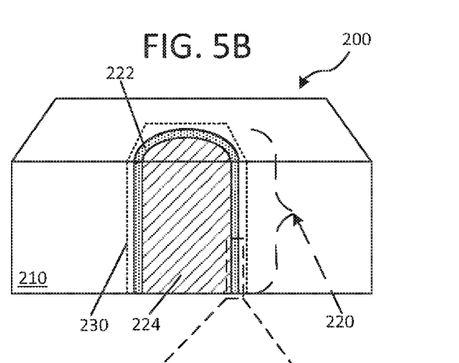
FIG. 5B illustrates a cross-section view of the example IC of FIG. 5A taken along dashed line α-α therein.

FIG. 5A illustrates a top-down view of an example IC 200 after deposition of an electrically conductive material 224, in accordance with an embodiment of the present invention. FIG. 5B illustrates a cross-section view of the example IC 200 of FIG. 5A along dashed line α-α therein. As can be seen, and in accordance with an embodiment, an electrically conductive material 224 may be deposited in the remainder 211' of through-hole 211 after deposition/formation of a layer of NTE material 222. Electrically conductive material 224 may be any material suitable for providing an electrical connection between the first surface 212 of the substrate 210 to its opposing surface 214, including, but not limited to: copper (Cu); tungsten (W); aluminum (Al); silver (Ag); gold (Au); titanium (Ti); and/or alloys thereof. Electrically conductive material 224 may be deposited as conventionally done. In accordance with an embodiment, conductive material 224 may be deposited using any suitable deposition techniques, including, but not limited to: electroplating (e.g., bottom-up filling); electroless deposition; and/or custom/modified variations of such processes. Other suitable materials and/or deposition processes for electrically conductive material 224 will depend on a given application and will be apparent in light of this disclosure. Further, as previously explained, a preliminary seed layer may be provided prior to deposition/formation of the conductive material, as may other layers (e.g., diffusion barrier layer or other liner).

Figure 5C:
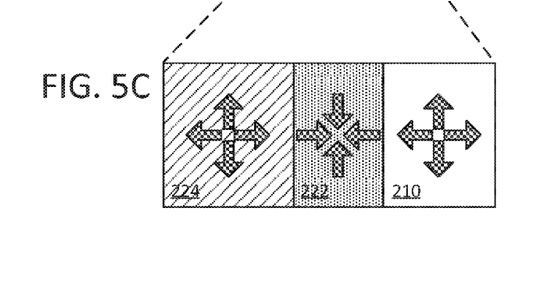
FIG. 5C illustrates a partial view of a TSV configured in accordance with an embodiment of the present invention, the view corresponding to the portion of FIG. 5B enclosed by the dashed box therein.

FIG. 5C illustrates a partial view of a TSV 220 configured in accordance with an embodiment of the present invention, the view corresponding to the portion of FIG. 5B enclosed by the dashed box therein. Upon experiencing an increase in temperature (e.g., heating such as may occur during thermal processing and/or temperature cycling of TSV 220), each of substrate 210 (e.g., silicon) and electrically conductive material 224 (e.g., a high-CTE material such as copper) will expand, while NTE material 222 (e.g., $ZrW_2O_8$ or $HfW_2O_8$) will contract, as generally represented by, but not limited to, the corresponding directional arrows depicted. Consequently, NTE material 222 will offset/accommodate expansion of the conductive core material 224 at least to some degree, thereby reducing the stress level to which substrate 210 is subjected and thus generally improving the reliability of TSV 220 (e.g., by reducing/eliminating substrate cracking, interface delamination, and/or transistor performance degradation).

As previously discussed, a keep-out-zone (KOZ) may be designated around a TSV to denote the region where device performance will be degraded if additional components are included therein. In some cases, KOZs may be designated to correspond with, for example, thermal management and/or mounting constraints imposed on an IC. As discussed above with reference to FIGS. 1A and 1B, TSVs 120 typically have large KOZs 130. Conversely, as illustrated by FIGS. 5A and 5B and in accordance with an embodiment of the present invention, implementation of an NTE material 222 may allow for decreases in the size (e.g., in one or more dimensions) of the minimum KOZ 230 surrounding a TSV 220, as best illustrated by comparing FIG. 5B with FIG. 1A. In some example cases, implementation of an NTE material 222 in the design of a TSV 220, in accordance with an embodiment, may reduce the size of KOZ 230 by as much as about 80*% (e.g., 15-75%) as compared to the KOZ 130 designated around TSV 120. In turn, this may improve device scaling, increase cost-effectiveness, and/or minimize design/manufacturing restrictions, in accordance with an embodiment.

As previously noted, NTE material 222 may be chosen, at least in part, based on its ability to act as a sufficient barrier layer, and thus eliminate the need for barrier deposition processing steps which are sometimes attendant conventional methodologies. Therefore, and in accordance with a specific example embodiment, a layer (of a given thickness) of zirconium tungstate ($ZrW_2O_8$), which has a density of about 6.33 g/cm$^3$, may be implemented as NTE material 222 and may act as a suitable barrier layer which protects against one or more of leakage, voltage breakdown, and/or diffusion of the conductive core material 224 (e.g., copper). As will be appreciated, in some cases the effectiveness of NTE material 222 as a barrier layer may be proportional to its density; that is, as the density of a given NTE material 222 increases, so too does its effectiveness as a barrier layer. Other suitable densities/configurations which enable NTE material 222 to suffice as a barrier layer will depend on a given application and will be apparent in light of this disclosure. If so desired, a supplemental barrier material may be deposited as well.

Also, as previously noted, NTE material 222 may be chosen, at least in part, based on its ability to allow deposition and/or adhesion of a suitable seed layer of electrically conductive core material 224 which enables substantially seamless deposition thereafter of the remainder of the conductive core material 224 to fill the TSV 220. In accordance with an embodiment of the present invention, the thickness of the seed layer may be in the range of about 10-500 Å (e.g., a monolayer, or about 1-20 nm). In one specific example embodiment, a seed layer of electrically conductive core material 224 (e.g., copper) may be deposited/formed by ALD on a portion of TSV 220 (e.g., directly on oxide film; on the bottom portion of TSV 220 corresponding with bottom surface 214 of substrate 210), and the remainder of TSV 220 subsequently may be filled with conductive material 224 (e.g., copper) by electroplating. Other suitable deposition techniques for formation of the seed layer of electrically conductive material 224 will depend on a given application and will be apparent in light of this disclosure.

As will be appreciated, NTE material 222 (e.g., $ZrW_2O_8$, $HfW_2O_8$, and/or other suitable NTE material) inherently may have a higher capacitance than, for example, $SiO_2$ dielectric layer 122 implemented in the design of TSVs 120. Therefore, and in accordance with an embodiment of the present invention, it may be desirable to reduce the overall capacitance of TSV 220, as determined according to the following relationship for capacitors in series:

$$C_{Total} = \frac{1}{\frac{1}{C_1} + \frac{1}{C_2} + \dots \frac{1}{C_n}}$$

Thus, and in accordance with one specific example embodiment, the total capacitance of a TSV 220 implementing an NTE material 222 may be reduced/mitigated by increasing the aspect ratio of the TSV 220, for instance. As previously discussed, NTE material 222 may be well-suited for higher-aspect-ratio TSVs. In accordance with another example embodiment, the total capacitance of a TSV 220 implementing an NTE material 222 may be reduced/mitigated by including an intermediate layer of $SiO_2$ between substrate 210 and NTE material 222. In one specific example embodiment, a light oxidation of substrate 210 (e.g., silicon) may be performed before deposition of NTE material 222, thus forming a thin capacitance layer (e.g., $SiO_2$) there between. Other suitable techniques for reducing/mitigating increases in capacitance will depend on a given application and will be apparent in light of this disclosure.

Figure 6:
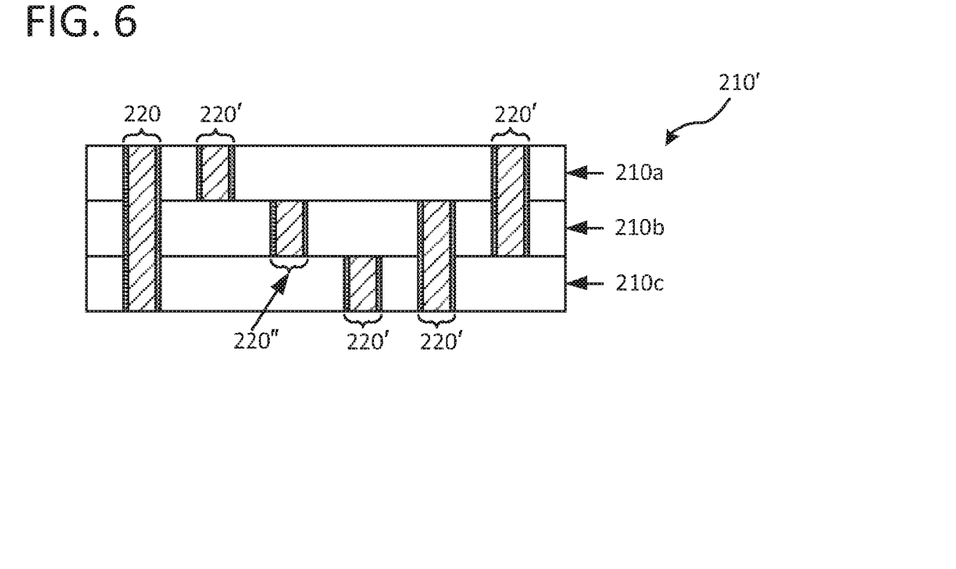
FIG. 6 illustrates a cross-section view of an example IC implementing TSVs configured in accordance with an embodiment of the present invention.

FIG. 6 illustrates a cross-section view of an example IC 210' implementing TSVs 220 configured in accordance with an embodiment of the present invention. As previously noted above with reference to FIG. 3B, one or more TSVs 220 may be implemented, in some embodiments, in a substrate having multiple layers. As can be seen in FIG. 6, for example, substrate 210' may have multiple layers (e.g., substrate layers 210a, 210b, 210c, etc.), and a given TSV 220 may be configured, for example, to run through the entire multi-layer substrate 210' and/or through only a portion thereof (e.g., a blind TSV 220', a buried TSV 220", etc.). Other suitable configurations for TSVs 220 implemented in a multi-layered substrate 210' will depend on a given application and will be apparent in light of this disclosure.

Figure 7:
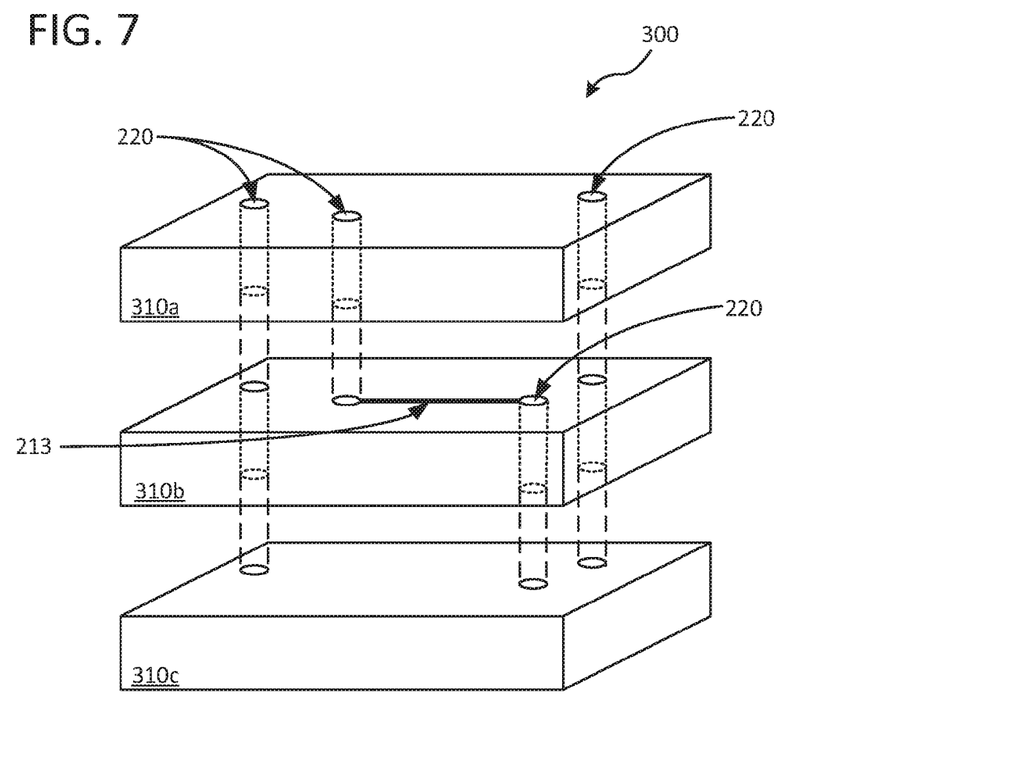
FIG. 7 illustrates a perspective view of an example stacked IC implementing TSVs configured in accordance with an embodiment of the present invention.

FIG. 7 illustrates a perspective view of an example stacked IC 300 implementing TSVs 220 configured in accordance with an embodiment of the present invention. As previously noted above with reference to FIG. 3B, a given substrate may be in contact with another one or more laterally/vertically adjacent substrates and/or IC components, in some embodiments. As can be seen in FIG. 7, for example, a stacked IC 300 may include multiple ICs (e.g., ICs 310a, 310b, 310c, etc.) and may implement one or more TSVs 220 configured, for example, to operatively connect one or more of the ICs of stacked IC 300. In some cases, a conductive run 213 may be included to operatively connect one or more TSVs 220, thereby facilitating interconnection/operative coupling of the ICs of stacked IC 300. As will be appreciated in light of this disclosure, and in accordance with an embodiment of the present invention, TSVs 220 may be implemented to form a stacked IC 300 including, for example, a processor chip, DRAM, ROM, a communication chip, and/or other componentry (e.g., of computing system 1000 discussed below with reference to FIG. 8). Other suitable configurations for TSVs 220 implemented in a stacked IC 300 will depend on a given application and will be apparent in light of this disclosure. For example, in some embodiments, one or more TSVs 220 may be implemented in an interposer (e.g., a single piece of thinned silicon or other suitable substrate material) on which multiple ICs/chips with various functions may be operatively coupled.

Example System

Figure 8:
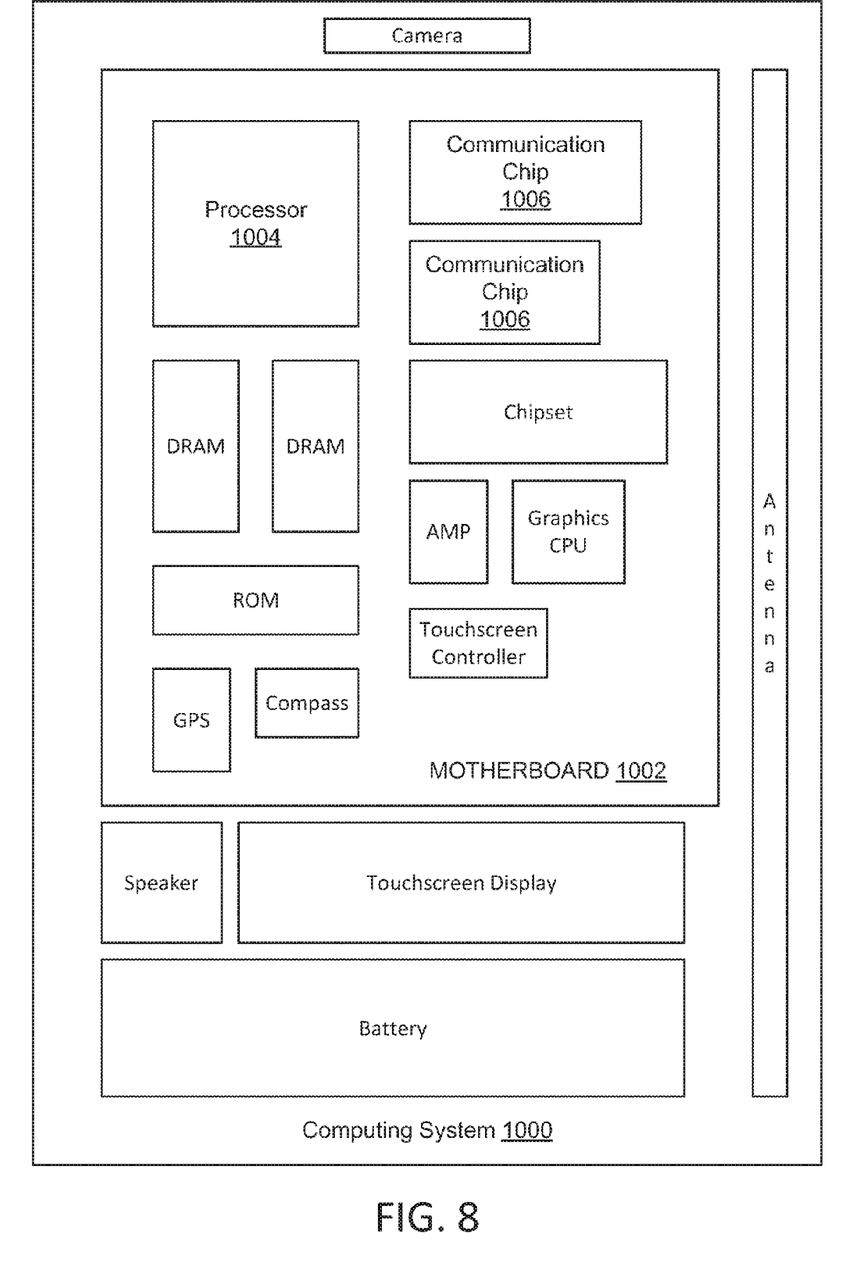
FIG. 8 illustrates a computing system implemented with integrated circuit structures or devices formed with one or more TSVs configured in accordance with an example embodiment of the present invention.

FIG. 8 illustrates a computing system 1000 implemented with integrated circuit structures or devices formed with one or more through-silicon vias (TSVs) 220 configured in accordance with an example embodiment of the present invention. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed with one or more TSVs 220 in accordance with an example embodiment of the present invention (e.g., three-dimensional IC and/or other three-dimensional package). These TSVs 220 can be used, for instance, to implement multi-layer/stacked IC structures having any one of the structures electrically coupled to any other layer of the structure by one or more TSVs 220. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family). IEEE 802.20, long term evolution (LTE), Ev-DO. HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments of the present invention, the integrated circuit die of the processor includes onboard memory circuitry that is implemented with one or more integrated circuit structures or devices formed with one or more TSVs 220, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed with one or more TSVs 220 as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the system 1000 may be any other electronic device that processes data or employs one or more integrated circuit structures or devices formed with one or more TSVs 220, as described herein.

Numerous embodiments will be apparent in light of this disclosure. One example embodiment of the present invention provides an integrated circuit including a substrate having a through-hole formed therein, an electrically conductive material disposed within the through-hole, wherein the electrically conductive material provides an electrical connection between a first surface and a second surface of the substrate, and a negative thermal expansion (NTE) material disposed within the through-hole between the substrate and the electrically conductive material. In some cases, the substrate comprises silicon, germanium, III-V material, oxide, nitride, or combinations thereof. In some cases, the through-hole has an aspect ratio greater than or equal to about 1:10. In some cases, the NTE material comprises zirconium tungstate ($ZrW_2O_8$). In some cases, the NTE material comprises hafnium tungstate ($HfW_2O_8$). In some cases, the integrated circuit further includes a capacitance layer disposed between the substrate and the NTE material. In some such cases, the capacitance layer comprises silicon dioxide. In some cases, the integrated circuit is configured to align with another substrate, chip, layer, die, and/or integrated circuit to form a three-dimensional integrated circuit or other three-dimensional package. In some cases, the NTE material provides a barrier that protects against at least one of leakage, voltage breakdown, and/or diffusion of the electrically conductive material. In some cases, the integrated circuit further includes a seed layer of the electrically conductive material. In some cases, the through-hole has an aspect ratio greater than or equal to about 1:10 and the NTE material reduces radial stress in the through-hole.

Another example embodiment of the present invention provides a method including the steps of forming a through-hole in a substrate, depositing a negative thermal expansion (NTE) material on an interior surface of the through-hole, and filling the through-hole with an electrically conductive material, wherein the electrically conductive material provides an electrical connection between a first surface and a second surface of the substrate. In some cases, the substrate comprises silicon, germanium, III-V material, oxide, nitride, or combinations thereof. In some cases, the through-hole has an aspect ratio greater than or equal to about 1:10. In some cases, the NTE material comprises zirconium tungstate ($ZrW_2O_8$) or hafnium tungstate ($HfW_2O_8$). In some cases, the NTE material is deposited by atomic layer deposition, chemical vapor deposition, and/or physical vapor deposition. In some cases, the electrically conductive material comprises copper, tungsten, aluminum, or an alloy thereof. In some cases, the electrically conductive material is deposited by electroplating or electroless deposition. In some cases, the method further includes the step of depositing a seed layer of the electrically conductive material prior to filling the through-hole with the electrically conductive material. In some such cases, the seed layer of the electrically conductive material is greater than or equal to about 1-20 nm in thickness. In some cases, the method further includes the step of forming a capacitance layer between the substrate and the NTE material. In some such cases, the capacitance layer comprises silicon dioxide. In some cases, an integrated circuit is fabricated using the method. In some cases, an electronic device comprises one or more of such integrated circuit. In some such cases, the device includes at least one of a memory circuit, a communication chip, a processor, and/or a computing system.

Another example embodiment of the present invention provides an integrated circuit including a silicon substrate having a through-hole formed therein, a quantity of copper disposed within the through-hole, wherein the copper provides an electrical connection between a first surface and a second surface of the silicon substrate, and a negative thermal expansion (NTE) material disposed within the through-hole between the silicon substrate and the copper. In some cases, the through-hole has an aspect ratio greater than or equal to about 1:10, and the NTE material reduces radial stress in the through-hole. In some cases, the NTE material comprises zirconium tungstate ($ZrW_2O_8$) or hafnium tungstate ($HfW_2O_8$). In some cases, the integrated circuit further includes a capacitance layer disposed between the silicon substrate and the NTE material. In some such cases, the capacitance layer comprises silicon dioxide.

The foregoing description of example embodiments of the invention has been presented for the purposes of illustration and description. It is not intended to be exhaustive or to limit the invention to the precise forms disclosed. Many modifications and variations are possible in light of this disclosure. It is intended that the scope of the invention be limited not by this detailed description, but rather by the claims appended hereto.

What is claimed is:

1. A method of forming an integrated circuit, the method comprising:
    forming a through-hole in a substrate;
    forming a layer of negative thermal expansion (NTE) material over an interior surface of the through-hole, the layer of NTE material including zirconium tungstate ($ZrW_2O_8$) formed by depositing a zirconium precursor via atomic layer deposition (ALD), and depositing a tungsten precursor via ALD by alternating exposure of the substrate to saturating doses of water, ozone, and bis(tert-butylimino)bis(dimethylamino)tungsten(VI); and
    disposing an electrically conductive material within the through-hole such that the layer of NTE material is disposed between the interior surface of the through-hole and the electrically conductive material, wherein the electrically conductive material provides an electrical interconnect between a first surface of the substrate and an opposing second surface of the substrate.

2. The method of claim 1, wherein forming the layer of NTE material comprises at least one of an atomic layer deposition (ALD) process, a chemical vapor deposition (CVD) process, and a physical vapor deposition (PVD) process.

3. The method of claim 1, wherein the zirconium precursor and the tungsten precursor have a stoichiometric ratio of 1:2.

4. The method of claim 1, wherein depositing the zirconium precursor comprises:
    alternating exposure of the substrate to saturating doses of water and at least one of zirconium tetrachloride ($ZrCl_4$) and a tetrakis(amido)zirconium(IV) precursor.

5. The method of claim 1, wherein at least one of depositing the zirconium precursor and depositing the tungsten precursor is carried out at a temperature in the range of about 300-350° C.

6. The method of claim 5, wherein the method further comprises:
    heating the layer of NTE material in an environment having a temperature in the range of about 300-450° C.

7. The method of claim 1, wherein disposing the electrically conductive material within the through-hole comprises:
    forming a seed layer of the electrically conductive material over the interior surface of the through-hole.

8. The method of claim 1, wherein prior to forming the layer of NTE material over the interior surface of the through-hole, the method further comprises:
    forming a capacitance layer over the interior surface of the through-hole such that the capacitance layer is disposed between the interior surface of the through-hole and the layer of NTE material.

9. The method of claim 8, wherein the capacitance layer comprises silicon dioxide ($SiO_2$).

10. The method of claim 1, wherein the through-hole has a width-to-length aspect ratio greater than or equal to about 1:10.

11. The method of claim 1, wherein the through-hole has:
    a width in the range of about 1-10 μm; and
    a length in the range of about 1-200 μm.

12. The method of claim 1, wherein the substrate comprises at least one of silicon (Si), germanium (Ge), III-V material, an oxide, and a nitride.

* * * * *